United States Patent
Hasegawa

(10) Patent No.: US 8,729,789 B2
(45) Date of Patent: May 20, 2014

(54) DISPLAY APPARATUS

(75) Inventor: Toshinori Hasegawa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 301 days.

(21) Appl. No.: 13/295,429

(22) Filed: Nov. 14, 2011

(65) Prior Publication Data

US 2012/0133575 A1    May 31, 2012

(30) Foreign Application Priority Data

Nov. 30, 2010 (JP) ................. 2010-266660
Oct. 31, 2011 (JP) ................. 2011-238493

(51) Int. Cl.
*H01L 51/50* (2006.01)

(52) U.S. Cl.
USPC ............. 313/501; 313/504; 313/506

(58) Field of Classification Search
USPC ................. 313/504, 506, 501
See application file for complete search history.

(56) References Cited

U.S. PATENT DOCUMENTS

| | | | |
|---|---|---|---|
| 7,538,487 B2 | 5/2009 | Hasegawa et al. | |
| 7,750,563 B2 | 7/2010 | Hasegawa | |
| 7,915,812 B2 | 3/2011 | Hasegawa | |
| 8,004,189 B2 | 8/2011 | Hasegawa et al. | |
| 2009/0079336 A1* | 3/2009 | Yamada et al. | 313/504 |
| 2009/0115315 A1 | 5/2009 | Takaya et al. | |
| 2011/0024736 A1* | 2/2011 | Kambe et al. | 257/40 |

FOREIGN PATENT DOCUMENTS

| | | |
|---|---|---|
| JP | 2004-39500 A | 2/2004 |
| JP | 2009-49135 A | 3/2009 |
| JP | 2010003577 A | 1/2010 |

OTHER PUBLICATIONS

Chinese Office Action issued in counterpart application No. 201110390533.1 dated Jan. 8, 2014, along with its English-language translation—11 pages.

* cited by examiner

*Primary Examiner* — Mary Ellen Bowman
(74) *Attorney, Agent, or Firm* — Fitzpatrick, Cella, Harper & Scinto

(57) ABSTRACT

Provided is a display apparatus, which has both high light-emission efficiency and good display performance. The display apparatus includes multiple pixels, each of the multiple pixels including an organic light-emitting device including a first electrode, a light-emitting layer, and a second electrode, the multiple pixels including an optical unit for allowing a part of light emitted from the light-emitting layer to exit to outside while changing an exiting direction thereof, in which, in the multiple pixels including the optical unit, an optical distance between the light-emitting layer and the first electrode or an optical distance between the light-emitting layer and the second electrode is set to a predetermined value.

3 Claims, 2 Drawing Sheets

DISPLAY APPARATUS

BACKGROUND OF THE INVENTION

1. Field of the Invention

The present invention relates to a display apparatus using organic light-emitting devices (organic electroluminescence (EL) devices).

2. Description of the Related Art

In recent years, a display apparatus using organic light-emitting devices for displaying multiple different emission colors has attracted attention as a display apparatus replacing conventional CRTs and LCDs. Each of the organic light-emitting devices is a spontaneous emission device which includes multiple organic compound layers including a light-emitting layer interposed between an anode and a cathode. Therefore, the display apparatus using the organic light-emitting devices exhibits excellent performance in terms of contrast and color reproducibility.

The organic light-emitting device is a thin-film light-emitting device in which multiple thin films having different functions are laminated. For this structure, a light confinement effect is generated due to a total reflection effect which is characteristic to the thin-film light-emitting device. Therefore, emitted light, which can be extracted to the outside of the device, of light generated inside the device is only about 20 to 30%. Therefore, the thin-film light-emission device has a problem in that efficiency of extracting emitted light to the outside is low.

In order to solve the problem described above, for example, a display apparatus in which a microlens is provided on an emission extracting surface side of an organic light-emitting device to enable the efficient extraction of emitted light to the outside of the device is proposed (see Japanese Patent Application Laid-Open No. 2004-039500).

In the technology described in Japanese Patent Application Laid-Open No. 2004-039500, a method for improving the light-emission efficiency by the microlenses is described. However, display performance in terms of color reproducibility when the organic light-emitting devices provided with the microlenses are used for the display apparatus has not been examined.

SUMMARY OF THE INVENTION

In view of the problems described above, the present invention has an object to provide a display apparatus using organic light-emitting devices provided with a microlens, which has both high light-emission efficiency and good display performance.

A structure of the present invention made to achieve the aforementioned object is as follows.

That is, a display apparatus according to the present invention includes multiple pixels, each of the multiple pixels including an organic light-emitting device including a first electrode, a light-emitting layer, and a second electrode, the multiple pixels including an optical unit for allowing a part of light emitted from the organic light-emitting device to exit to outside while changing an exiting direction thereof, in which, in the multiple pixels, an optical distance $L_1$ between a light-emission position of the organic light-emitting device and the first electrode and an optical distance $L_2$ between the light-emission position and the second electrode satisfy Expressions below:

$$2L_1/\lambda + \phi_1/2\pi = 1; \text{ and}$$

$$L_2 > 0, \text{ and } 2L_2/\lambda + \phi_2/2\pi < 1,$$

where $\lambda$ is a maximum peak wavelength of a spectrum of light emitted from the organic light-emitting device, $\phi_1$ is a phase shift occurring when the light emitted at the light-emission position is reflected by the first electrode, and $\phi_2$ is a phase shift occurring when the light emitted at the light-emission position is reflected by the second electrode.

According to the present invention, the organic light-emitting device is set with the lowest-order of optical interference. Therefore, light emitted with high color purity can be extracted with good color reproducibility by the optical unit to the outside of the display apparatus. Therefore, an excellent effect of providing the display apparatus having both high light-emission efficiency and good display performance is exerted.

Further features of the present invention will become apparent from the following description of exemplary embodiments with reference to the attached drawings.

DESCRIPTION OF THE EMBODIMENTS

Hereinafter, an embodiment of the present invention is described referring to the accompanying drawings. However, the present invention is not limited to this embodiment. To a part which is not particularly illustrated or described in this specification, known or common technologies in the technical field are applied.

(Configuration of Display Apparatus)

Figure 1:
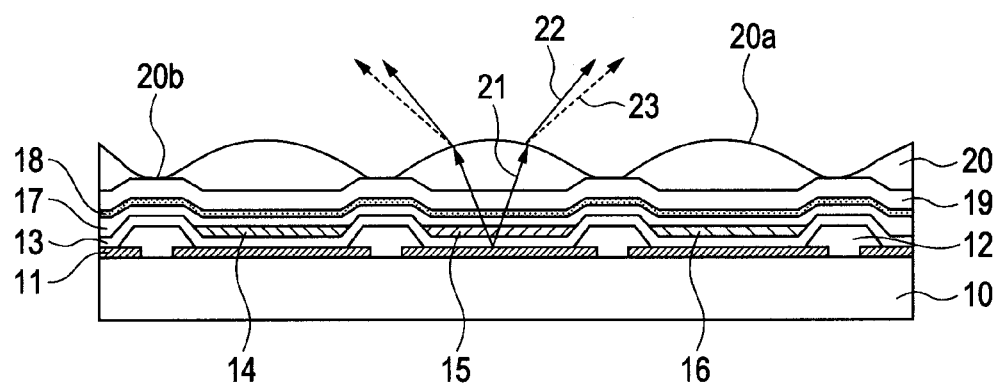
FIG. 1 is a partial sectional view illustrating a layer structure of a display apparatus according to an embodiment of the present invention.
Figure 2:
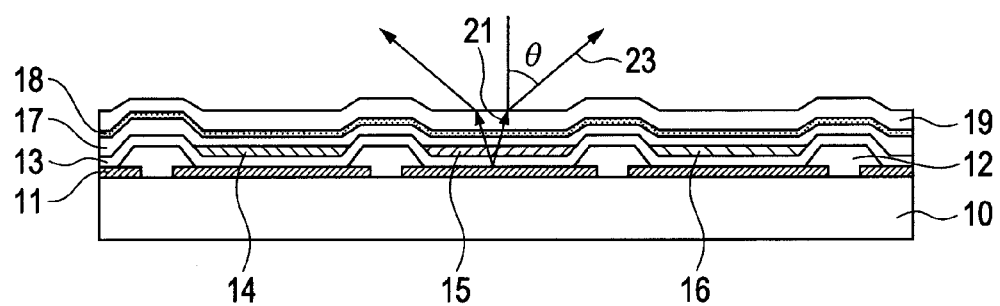
FIG. 2 is a partial sectional view illustrating a layer structure of a conventional display apparatus.

First, referring to FIG. 1, an embodiment of a display apparatus according to the present invention is described. FIG. 1 is a partial sectional view illustrating a layer structure of the display apparatus according to the embodiment of the present invention, whereas FIG. 2 is a partial sectional view illustrating a layer structure of a conventional display apparatus.

As illustrated in FIG. 1, the display apparatus according to this embodiment is a top-emission type display apparatus in which light is extracted from an upper surface of an organic light-emitting device formed on a substrate 10.

The display apparatus according to this embodiment includes the substrate 10 and multiple pixels formed in matrix on the substrate 10. The multiple pixels constitute a display region. The pixel herein means a region corresponding to one light-emitting device. In this embodiment, the display apparatus which includes the organic light-emitting devices emitting red (R) light, green (G) light, and blue (B) light formed respectively in the multiple pixels is described as an example. Colors of light emission of the display apparatus are not particularly limited as long as the number of colors is at least two, and the organic light-emitting device emitting light of any color can be used.

A pixel isolation layer 12 for isolating the pixels from each other is provided between the organic light-emitting devices. Each of the organic light-emitting devices is provided between an anode electrode 11 and a cathode electrode 18. Between the pair of electrodes 11 and 18, a hole injection/transport organic compound layer 13, a pattern layer 14 including a red-light-emitting layer, a pattern layer 15 including a green-light-emitting layer, a pattern layer 16 including a blue-light-emitting layer, and an electron injection/transport organic compound layer 17 are provided. Hereinafter, the pattern layers 14 to 16 are referred to simply as the light-emitting layers 14 to 16. More specifically, the anode electrode 11 patterned for each pixel is formed on the substrate 10. On the anode electrode 11, the hole injection/transport organic compound layer 13 and the light-emitting layers 14 to 16 are formed. On the light-emitting layers 14 to 16, the electron injection/transport organic compound layer 17 is formed. Further, the cathode electrode 18 is formed thereon.

The anode electrode (first electrode) 11 is made of an electrically conductive metal material having high reflectance, for example, Ag or the like. The anode electrode 11 may be formed of a laminate including a layer made of the metal material as described above and a layer made of a transparent electrically-conductive material such as indium-tin-oxide (ITO) excellent in hole injection properties.

Meanwhile, the cathode electrode (second electrode) 18 is formed commonly to the multiple organic light-emitting devices. The cathode electrode 18 has a structure with a semi-reflective property or a light-transmitting property, which allows the light emitted from the light-emitting layers 14 to 16 to be extracted to the outside of the device. More specifically, when the cathode electrode 18 has the structure with the semi-reflective property in order to enhance an interference effect inside of the device, a layer made of an electrically-conductive metal material excellent in electron injection properties such as Ag and AgMg is formed to have a thickness of 2 to 50 nm to form the cathode electrode 18. The term "semi-reflective property" means a property of reflecting a part of the light generated inside and emitted from the device and transmitting the other part of the emitted light, and has a reflectance of 20 to 80% with respect to visible light. The term "light-transmitting property" means a property with a transmission rate of 80% or higher with respect to the visible light.

The hole injection/transport organic compound layer 13 is formed of a single layer or multiple layers made of an organic compound having hole injection and transport properties. As an example of a structure of the hole injection/transport organic compound layer 13, for example, a single layer of a hole injection layer, a single layer of a hole transport layer, or a laminate structure of the hole injection layer and the hole transport layer is given. As a material for forming the hole injection/transport organic compound layer 13, a known material can be used.

The material of each of the light-emitting layer 14 for emitting red light, the light-emitting layer 15 for emitting green light, and the light-emitting layer 16 for emitting blue light is not particularly limited, and a known material can be used. For example, a single layer made of a material having both a luminescent property and a carrier transport property or a layer made of a mixture of a host material having a carrier transport property and a luminescent material such as a fluorescent material or a phosphorescent material can be used.

The electron injection/transport organic compound layer 17 is formed of a single layer or multiple layers made of an organic compound having electron injection/transport properties. As an example of a structure of the electron injection/transport organic compound layer 17, for example, a single layer of an electron injection layer, a single layer of an electron transport layer, or a laminate structure of the electron injection layer and the electron transport layer is given. As a material for forming the electron injection/transport organic compound layer 17, a known material can be used.

Pixel circuits are formed on the substrate 10 so as to be able to independently drive each of the organic light-emitting devices. The pixel circuits are formed of a plurality of transistors (not shown). The substrate 10, on which the transistors are formed, is covered with an interlayer insulating film (not shown) through which contact holes for electrically connecting the transistors and the anode electrodes 11 to each other are formed. On the interlayer insulating film, a planarizing film (not shown) for absorbing unevenness of a surface due to the formation of the pixel circuits to level the surface is formed.

On the cathode electrode 18, a protective layer 19 for protecting the organic light-emitting devices from oxygen or water contained in air is formed.

On a light-extracting side (upward direction of FIG. 1) of the protective layer 19, multiple microlenses 20a are formed in array as an optical unit. The microlenses 20a have a light-condensing effect for changing an exiting direction of at least a part of the light generated in the light-emitting layers and allowing the light to exit to the outside.

The microlenses 20a are formed by, for example, processing a resin material. More specifically, the microlenses 20a can be formed by a method such as embossing. A light-condensing effect of the microlenses 20a depends on a light-emitting area, a curvature of each of the microlenses, and a distance from a light-emitting surface to the microlens. Thus, it is preferred to design the microlenses by using the aforementioned elements as parameters. The dependence of the light-emitting area and the light-condensing property can be described as follows. Specifically, light emitted immediately under the center of the microlens is likely to condense in a front direction, whereas light emitted immediately below the periphery of the microlens is unlikely to condense in the front direction. The microlenses can also be formed by photolithography. Alternatively, the microlenses may be formed by the following method. A photosensitive material used as a microlens material is patterned by photolithography and is then reflowed by annealing to form a lens shape. Further alternatively, the photosensitive material may be directly formed into a lens shape by photolithography with a grey mask. Further alternatively, after a resist is applied onto the microlens material and is processed into the lens shape, the lens shape of the resist may be transferred to the microlens material by anisotropic etching. Further alternatively, after the microlenses are processed on another substrate, the thus processed microlenses may be bonded to the light-emitting devices.

The term "light condensing" herein means that light is condensed as compared with an exiting property of a light ray on a flat light-extracting surface on which the microlens is not present. As in the case of a normal lens, light emitted at a position which is situated shorter than a focal length is diffused even through a condensing lens as compared with parallel light. Even in this case, however, the light is refracted in the light-condensing direction as compared with the case where the microlens is not provided.

Although it is preferred to form the microlens 20a independently for each pixel (equivalent to the organic light-emitting device), multiple microlenses may be formed for one pixel, or one microlens may be formed for the multiple pixels. Moreover, depending on the shape of each of the microlenses 20a, a protective layer may be formed thereon.

(Effects and Interference Conditions of Display Apparatus)

With the configuration as described above, for example, when one microlens 20a is provided for one pixel, the light emitted from the organic light-emitting device is transmitted through the cathode electrode 18. Subsequently, the light is transmitted through the protective layer 19 and a microlens array 20 and is then emitted to the outside of the organic light-emitting device.

In the case where the microlenses 20a are not formed (see FIG. 2), light 21 emitted obliquely from the light-emitting layer exit at a wider angle (in a direction indicated by the arrows 23) when exiting from the protective layer 19. On the other hand, as illustrated in FIG. 1, with the configuration including the microlenses 20a, the exiting angle of lights 22, which are transmitted through the microlens and are then emitted to the outside, becomes closer to a vertical direction with respect to the substrate (in a direction indicated by the arrows 22) as compared with the case where the microlenses 20a are not provided. Therefore, as compared with the case where the microlenses 20a are not present, the light-condensing effect in the vertical direction with respect to the substrate is improved in the case where the microlenses 20a are present. Specifically, as the display apparatus, light utilization efficiency in the front direction can be enhanced.

With the configuration including the microlenses 20a, an incident angle of light beams 21 emitted obliquely from the light-emitting layer on an exiting interface (boundary between the lens 20a and the outside) becomes closer to be vertical due to the curvature of the lens. Therefore, the amount of light totally reflected at the interface is reduced to allow a larger amount of emitted light to be extracted to the outside of the display apparatus. Specifically, the light extracting efficiency is also improved.

Subsequently, optical interference conditions of the organic light-emitting device in the display apparatus according to this embodiment are described. In general, a thickness of each of the layers constituting each of the organic light-emitting devices is about several tens of nm. An optical distance obtained by multiplying a thickness (d) of each layer and a reflective index (n) of the corresponding layer (product of n and d) corresponds to about a fraction of a wavelength of visible light ($\lambda$=350 nm or longer and 780 nm or shorter). Therefore, inside the organic light-emitting device, multiple reflection and interference of the visible light occur in a noticeable manner. Therefore, the wavelength $\lambda$ enhanced by the interference effect (enhancing wavelength $\lambda$ due to the optical interference) is defined as expressed by Expression (1) below. Specifically, the enhancing wavelength $\lambda$ is defined by structure parameters of the light-emitting device such as an optical distance $L_1$ between a light-emission position and the first electrode and a phase shift $\phi_1$ occurring when the light is reflected by the first electrode, and an order $m_1$ of the optical interference. The enhancing wavelength $\lambda$ due to the optical interference is a maximum peak wavelength of a spectrum of the light extracted from the optical light-emitting device.

$$\lambda = 2L_1 \cos\theta/(m_1 - \phi_1/2\pi) \quad (m_1 \text{ is a positive integer, and } \theta \text{ is a radiation angle of light emission}) \quad (1)$$

In front, specifically, at the radiation angle $\theta$ of 0 degrees, Expression (2) below is established.

$$2L_1/\lambda + \phi_1/2\pi = m_1 \quad (2)$$

Among the two materials forming the interface, it is assumed that a material present on the light entering side is a medium I and the other material is a medium II and optical constants thereof are ($n_I$, $k_I$) and ($n_{II}$, $k_{II}$), respectively. Then, the phase shift $\phi_1$ at the interface can be expressed by Expression (3) below. The optical constants can be measured by using, for example, a spectroscopic ellipsometer or the like.

$$\phi_1 = 2\pi - \tan^{-1}(2n_I k_{II}/(n_I^2 - n_{II}^2 - k_{II}^2)) \quad (3)$$

The light emitted from the organic light-emitting device corresponds to emitted light released after the recombination of carriers inside the light-emitting layer, on which the optical interference effect is superimposed. Therefore, if the optical distance or the phase shift of each layer is changed, the enhancing wavelength according to Expression (1) or (2) also changes. Thus, the light-emitting characteristics of the organic light-emitting device can be adjusted.

First, optical interference conditions between the anode electrode 11 and the light-emission position of the organic light-emitting device included in the display apparatus according to this embodiment are described. When the interference of light emission occurs between the anode electrode 11 and the light-emission position, the case where the emitted light is reflected by the anode electrode 11 is considered for a phase shift amount. An actual measurement using an Al alloy allows the phase shift amount to be estimated as 3.84 (rad) (220.0 degrees) according to Expression (3) above. In the description of the specification of the present invention, the phase shift is described using 3.84 (rad) (220.0 degrees). However, the phase shift greatly depends on the metal material and further changes depending on a formation method and a formation apparatus. Therefore, for precision, it is necessary to actually measure the optical characteristics of the film formed in the apparatus to be used to calculate the phase shift.

In order to set the enhancing wavelength to 460 nm at the light emission radiation angle of 0 degrees (angle from a normal direction to the substrate), the optical distance $L_1$ between the anode electrode 11 and the light-emission position is set to 89 nm with $m_1$=1, 319 nm with $m_1$=2, and 549 nm with $m_1$=3 according to Expression (2) above. By Expression (1) above, the enhancing wavelength differs depending on the light emission radiation angle. Tables 1, 2, and 3 show the relation between the radiation angle and the enhancing wavelength at each of the optical distances.

TABLE 1

Optical distance 89 nm

| Radiation angle | $m_1$ = 1 | $m_1$ = 2 | $m_1$ = 3 |
|---|---|---|---|
| 0° | 460 nm | 129 nm | 75 nm |
| 5° | 458 nm | 128 nm | 75 nm |
| 10° | 453 nm | 127 nm | 74 nm |
| 15° | 444 nm | 124 nm | 72 nm |
| 20° | 432 nm | 121 nm | 70 nm |
| 25° | 417 nm | 117 nm | 68 nm |
| 30° | 398 nm | 112 nm | 65 nm |
| 35° | 377 nm | 105 nm | 61 nm |
| 40° | 352 nm | 99 nm | 57 nm |
| 45° | 325 nm | 91 nm | 53 nm |
| 50° | 296 nm | 83 nm | 48 nm |
| 55° | 264 nm | 74 nm | 43 nm |
| 60° | 230 nm | 64 nm | 37 nm |
| 65° | 194 nm | 54 nm | 32 nm |
| 70° | 157 nm | 44 nm | 26 nm |
| 75° | 119 nm | 33 nm | 19 nm |
| 80° | 80 nm | 22 nm | 13 nm |
| 85° | 40 nm | 11 nm | 7 nm |
| 90° | — | — | — |

TABLE 2

Optical distance 319 nm

| Radiation angle | $m_1 = 1$ | $m_1 = 2$ | $m_1 = 3$ |
|---|---|---|---|
| 0° | 1,643 nm | 460 nm | 267 nm |
| 5° | 1,637 nm | 458 nm | 266 nm |
| 10° | 1,618 nm | 453 nm | 263 nm |
| 15° | 1,587 nm | 444 nm | 258 nm |
| 20° | 1,544 nm | 432 nm | 251 nm |
| 25° | 1,489 nm | 417 nm | 242 nm |
| 30° | 1,423 nm | 398 nm | 232 nm |
| 35° | 1,346 nm | 377 nm | 219 nm |
| 40° | 1,259 nm | 352 nm | 205 nm |
| 45° | 1,162 nm | 325 nm | 189 nm |
| 50° | 1,056 nm | 296 nm | 172 nm |
| 55° | 943 nm | 264 nm | 153 nm |
| 60° | 822 nm | 230 nm | 134 nm |
| 65° | 694 nm | 194 nm | 113 nm |
| 70° | 562 nm | 157 nm | 91 nm |
| 75° | 425 nm | 119 nm | 69 nm |
| 80° | 285 nm | 80 nm | 46 nm |
| 85° | 143 nm | 40 nm | 23 nm |
| 90° | — | — | — |

TABLE 3

Optical distance 549 nm

| Radiation angle | $m_1 = 1$ | $m_1 = 2$ | $m_1 = 3$ |
|---|---|---|---|
| 0° | 2,827 nm | 791 nm | 460 nm |
| 5° | 2,816 nm | 788 nm | 458 nm |
| 10° | 2,784 nm | 779 nm | 453 nm |
| 15° | 2,730 nm | 764 nm | 444 nm |
| 20° | 2,656 nm | 744 nm | 432 nm |
| 25° | 2,562 nm | 717 nm | 417 nm |
| 30° | 2,448 nm | 685 nm | 398 nm |
| 35° | 2,315 nm | 648 nm | 377 nm |
| 40° | 2,165 nm | 606 nm | 352 nm |
| 45° | 1,999 nm | 559 nm | 325 nm |
| 50° | 1,817 nm | 509 nm | 296 nm |
| 55° | 1,621 nm | 454 nm | 264 nm |
| 60° | 1,413 nm | 396 nm | 230 nm |
| 65° | 1,195 nm | 334 nm | 194 nm |
| 70° | 967 nm | 271 nm | 157 nm |
| 75° | 732 nm | 205 nm | 119 nm |
| 80° | 491 nm | 137 nm | 80 nm |
| 85° | 246 nm | 69 nm | 40 nm |
| 90° | — | — | — |

According to Tables 1, 2, and 3, as the radiation angle and the $m_1$ value increase, the enhancing wavelength is shifted to be shorter as compared with the enhancing wavelength of the emitted light radiated in the front direction of the device.

Next, the angle (radiation angle) of the emitted light entering the microlenses 20a is considered. In this embodiment, the microlenses 20a are formed on the protective layer 19. As the material of the protective layer 19, an inorganic compound such as, for example, silicon nitride is used to protect the organic light-emitting device from oxygen and water contained in air. Moreover, the microlenses 20a are mainly formed of a resin material. Therefore, the protective layer 19 and the microlenses 20a have a difference in refractive index. In general, the inorganic compound such as silicon nitride has a higher refractive index than that of the resin material. Thus, total reflection occurs at the interface between the protective layer 19 and each of the microlenses 20a. A critical angle θc at which the total reflection occurs can be calculated according to Expression (4) described below using a refractive index $n_1$ of the protective layer 19 and a refractive index $n_2$ of the microlenses 20a.

$$\theta_c = \sin^{-1}\left(\frac{n_2}{n_1}\right) \quad (4)$$

For example, supposing that the refractive index of the protective layer 19 is 1.80 and the refractive index of the microlens 20a is 1.68, the critical angle is 69 degrees. Therefore, of all the light generated in and emitted from the organic light-emitting device, light at the radiation angle up to 69 degrees enters the microlens 20a. In the case where the emitted light is allowed to directly exit from the protective layer 19 to the outside of the display apparatus without providing the microlenses 20a, the critical angle is about 34 degrees according to Expression (4) above with $n_1=1.80$ (refractive index of the protective layer) and $n_2=1.00$ (refractive index of air) when a refractive index of an external environment is 1. Specifically, the light emission at the radiation angle ranging from 34 to 69 degrees, which cannot be used in the display apparatus without the microlens, can be used by providing the microlenses 20a. The thus enhanced light utilization efficiency of the light emission is one of the advantages of providing the microlens.

When glass-cap sealing is used, the protective layer is not indispensable under the microlens 20a and therefore, the total reflection due to the difference in refractive index from the light-emitting layer to the microlens can be suppressed. In this case, the light reaches over the entire dimensional area of the microlens 20a.

The light reaching the microlens can be extracted to the outside depending on the angle of the boundary between the microlens and the outside by microlens design.

When the critical angle at which the light can enter the microlens from the protective layer is set to 69 degrees, the difference in refractive index between the organic compound layer and the protective layer is small, and therefore the radiation angles shown in Tables 1, 2, and 2 are approximately replaced by the radiation angle in the protective layer provided on the cathode electrode. Assuming the optical distance of the organic light-emitting device is 89 nm in the display apparatus including the microlens, the enhancing wavelength of the emitted light entering the microlens 20a correspond to the values at the radiation angle of 0 degrees to the vicinity of 70 degrees described in Table 1. The enhancing wavelength is 460 nm to 157 nm when $m_1=1$, 129 nm to 44 nm when $m_1=2$, and 75 nm to 26 nm when $m_1=3$. In general, a wavelength range of the visible light visually recognized by the human eye is from 380 nm to 780 nm. Therefore, the light emission recognized by an observer of the display apparatus in the case where the optical distance $L_1$ of the organic light-emitting device is set to 89 nm is mainly limited to the enhanced light emission which satisfies the condition $m_1=1$. The enhancing wavelength of the light entering the microlens under the condition of $m_1=2$ or $m_1=3$ corresponds to an enhancing condition for the light at a wavelength other than a visible wavelength. The organic light-emitting device used for the display apparatus generally includes the light-emitting layer which emits the light in the visible wavelength range. Therefore, the wavelength enhancing conditions such as $m_1=2$ and $m_1=3$ do not affect the light-emitting characteristics of the organic light-emitting device. Therefore, the light-emitting characteristics of the organic light-emitting device are determined by the optical interference conditions with $m_1=1$.

Subsequently, assuming that the optical distance of the organic light-emitting device is 319 nm, the enhancing wavelength of the emitted light entering the microlens 20a correspond to the values at the radiation angle of about 0 degrees to the vicinity of 70 degrees shown in Table 2. The enhancing wavelength is 1,643 nm to 562 nm when $m_1=1$, 460 nm to 157 nm when $m_1=2$, and 267 to 91 nm when $m_1=3$. In this case, it is the light emission enhanced under the condition $m_1=2$ and the light emission enhanced at the radiation angle of about 65 degrees to 70 degrees under the condition $m_1=1$ that affect the light emission in the visible wavelength range. The light emission enhanced under the condition $m_1=1$ has a longer wavelength than the enhancing wavelength of 460 nm under the condition $m_1=2$ in front of the display apparatus.

Assuming the optical distance of the organic light-emitting device is 549 nm, the enhancing wavelength of the emitted light entering the microlens $20a$ is the same as those shown in Table 3. The enhancing wavelength is 2,827 nm to 967 nm when $m_1=1$, 791 nm to 271 nm when $m_1=2$, and 460 nm to 157 nm when $m_1=3$. In this case, it is the light emission enhanced under the condition $m_1=3$ and the light emission enhanced at the radiation angle of 5 degrees to 60 degrees under the condition $m_1=2$ that affect the light emission in the visible wavelength range. Of the aforementioned light, the light emission enhanced at the radiation angle of 25 degrees to 50 degrees under the condition $m_1=2$ has a longer wavelength than the enhancing wavelength 460 nm under the condition $m_1=3$ in front of the display apparatus.

As described above, although the enhancing wavelength in front of the display apparatus is the same, that is, 460 nm, the enhancing wavelength of the emitted light entering the microlenses $20a$ varies depending on the optical distance of the organic light-emitting device. Table 4 collectively shows wavelength ranges corresponding to the visible-light wavelength range among the aforementioned emitted light entering the microlenses $20a$.

TABLE 4

| | | $m_1 = 1$ | $m_1 = 2$ | $m_1 = 3$ |
|---|---|---|---|---|
| Optical distance 89 nm | Upper limit | 460 nm | — | — |
| | Lower limit | 398 nm | — | — |
| Optical distance 319 nm | Upper limit | 694 nm | 460 nm | — |
| | Lower limit | 562 nm | 398 nm | — |
| Optical distance 549 m | Upper limit | — | 789 nm | 460 nm |
| | Lower limit | — | 396 nm | 398 nm |

In comparison between the aforementioned three display apparatuses, the display apparatus having the shortest optical distance of 89 nm has a narrow enhancing wavelength range of the emitted light entering the microlenses $20a$ as compared with the other display apparatuses. Further, in terms of the relation between the optical interference effect and the order $m_1$, it is known that the enhancing effect due to the optical interference is generally higher as the order $m_1$ becomes smaller. Therefore, the organic light-emitting devices with $m_1=2$ and $m_1=3$ shown in Tables 2 and 3 satisfy the interference conditions of lower orders at the same time. Therefore, a stronger enhancing effect is generated at a longer wavelength than that in front of the display apparatus. In the display apparatus described above, light having a wider variety of wavelengths and intensities enters the microlens as compared with the display apparatus with the order $m_1=1$. Therefore, color purity of the light emission is lowered. Further, interference of the lower orders also appears at an oblique viewing angle. Therefore, color changes in a complex manner.

Therefore, for the display apparatus of this embodiment, the optical distance between the light-emission position and the first electrode is set so as to satisfy the condition $m_1=1$ in Expression (2). In this manner, the display apparatus having high color purity of the light emission and good color reproducibility can be realized. Specifically, the optical distance $L_1$ between the light emission position and the first electrode is set to satisfy Expression (5) below.

$$2L_1/\lambda+\phi_1/2\pi=1 \qquad (5)$$

where $\phi_1$ is a phase shift occurring when the emitted light is reflected by the first electrode, and $\lambda$ is a maximum peak wavelength of a spectrum of the light extracted from the organic light-emitting device.

The enhancing effect due to the higher optical interference effect can be used by setting the optical distance of the organic light-emitting device under the condition $m_1=1$ as compared with the case where the optical distance is set under the condition $m_1>1$ when the same enhancing wavelength is to be set. Therefore, an advantage of improving the light-emission efficiency of the organic light-emitting device can be realized at the same time. In this manner, the display apparatus with high color purity of the light emission, which performs brighter display, that is, has good color reproducibility at a low power consumption, can be realized.

In the description of this embodiment, the optical distance between the anode electrode 11 and the light-emission position has been dealt with. However, when the light-emission region has an extent or a distribution inside the light-emitting layer, the optical distance is appropriately adjusted so as to satisfy the interference conditions in view of the distribution of the light-emitting region inside the light-emitting layer.

Moreover, in view of the case where the thickness of the organic compound layer varies when the film is formed, the optical distance $L_1$ may be offset from a value satisfying Expression (5) by an extremely small value. More specifically, the effects of the present invention can be obtained as long as Expression (5') is satisfied.

$$0.9<2/\lambda+\phi_1/2\pi<1.1 \qquad (5')$$

As described above, the display apparatus of this embodiment is realized paying attention to a change in the enhancing effect caused by the angle dependence of the enhancing wavelength due to the critical angle at the interface at which the emitted light enters the microlens $20a$ and the optical interference, and the order of the optical interference. The optical distance of the optical light-emitting device constituting the display apparatus is set so as to satisfy the optical interference condition $m_1=1$ at a desired enhancing wavelength. In this manner, the color purity and the light-emission efficiency of the organic light-emitting device can be improved. Therefore, the display apparatus with good color reproducibility, which performs bright display at low power consumption, can be provided.

In the case where the microlens is not provided, the emitted light at an angle of up to 34 degrees is allowed to exit from the protective layer of the display apparatus to the outside. In this case, even though the optical distance is 319 nm, only the light with $m_1=2$ is visually recognized. Accordingly, the viewing-angle characteristics with good color can be obtained at both the optical distance of 89 nm and the optical distance of 319 nm.

The enhancing wavelength to be set is not particularly limited. The enhancing wavelength can be applied to any organic light-emitting device as long as the organic light-emitting device includes the light-emitting layer which emits light in the visible wavelength range. The enhancing wavelength can also be applied to an RGB three primary-color type display apparatus or a four primary-color type display apparatus for, example, three primary colors plus cyan or yellow.

The optical interference conditions of this embodiment may be applied to all or part of the organic light-emitting devices constituting the display apparatus. Further, the optical interference conditions of this embodiment can be used differently for the respective light-emission colors. In particular, in the case of the blue-light-emitting device having a shorter emission wavelength, the enhancing wavelength to be set also becomes shorter. Therefore, the optical distance satisfying the optical interference condition becomes also shorter. For example, when the thickness of each layer of the organic light-emitting device is adjusted to reduce the optical distance, reliability or driving stability of the organic light-emitting device is sometimes lowered due to the reduction in thickness of the layer. In such a case, it is possible to use the interference condition $m_1>1$ for the blue-light-emitting device and the interference condition $m_1=1$ for the light-emitting devices for light emission of the other colors.

The optical interference conditions between the cathode electrode 18 and the light-emission position are described. In this case, the phase shift amount $\phi$ obtained when the emitted light is reflected by the cathode electrode 18 is considered. Supposing that the phase shift amount is $\phi_2$, $\phi_1$ in Expression (3) described above is replaced by $\phi_2$ to obtain $\phi_2$. When the cathode electrode 18 is formed of an Ag thin film, the phase shift amount $\phi_2$ is estimated to be 4.21 (rad) (241.4 degrees).

The cathode electrode 18 is a semi-transparent film located on the light exiting side. A reflectance of the cathode electrode 18 is about 40% at maximum although the reflectance depends on the thickness of the cathode electrode 18. Therefore, in comparison with the interference condition on the side of the anode electrode 11 having a high reflectance of 70% or higher, the optical distance which less affects the light emission but satisfies various optical interference conditions can be set. In particular, preferably, the optical distance $L_2$ between the cathode electrode 18 and the light-emission position satisfies Expression (6) below for the maximum peak wavelength $\lambda$ of the spectrum of the light emitted from the organic light-emitting device.

$$L_2>0, \text{ and } 2L_2/\lambda+\phi_2/2\pi<1 \qquad (6)$$

Specifically, the optical interference conditions between the cathode electrode 18 and the light-emission position are set so as to enhance a wavelength shorter than the enhancing wavelength on the anode electrode 11 side. For example, when the optical distance $L_2$ is set to 33.6 nm so as to satisfy Expression (6) in the organic light-emitting device having the wavelength of 520 nm, the optical interference condition of:

$$2L_2/\lambda+\phi_2/2\pi=1$$

is satisfied based on the estimation from the phase shift amount 4.21 (rad). Specifically, light having the wavelength of 204 nm is to be enhanced. The optical interference condition is for enhancing light having a wavelength shorter than the light enhanced by the interference on the anode electrode 11 side.

As described above, the optical interference condition on the cathode electrode 18 side is set to the order of a value smaller than 1. In this manner, the enhancing wavelength range of the emitted light entering the microlens is further narrowed. As a result, the display apparatus having higher color purity can be realized.

Moreover, the setting of the short optical distance on the cathode electrode 18 side is preferred because a total optical distance between the anode electrode 11 and the cathode electrode 18 can be set short.

Moreover, in the present invention, a member for allowing the emitted light to exit to the outside of the display apparatus is not particularly limited as long as the relation of angle dependence between the critical angle and the optical interference enhancing wavelength at the incident boundary with the member for allowing the emitted light to exit to the outside of the display apparatus is satisfied. Beside the microlens, the present invention is applicable when any members such as a prism-structured member, a concave-convex-structured member, and an anti-reflection member are provided.

(Steps of Manufacturing Display Apparatus)

Next, steps of manufacturing the display apparatus of this embodiment are described referring to FIGS. 3A to 3E. FIGS. 3A to 3E are explanatory views illustrating the steps of manufacturing the display apparatus of this embodiment. The manufacturing steps up to the formation of the cathode electrode 18 are known, and therefore the description thereof is herein omitted.

Figure 3A:
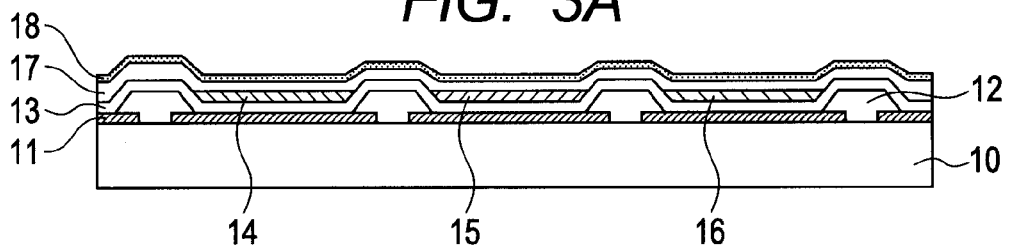
FIGS. 3A, 3B, 3C, 3D and 3E are explanatory views illustrating manufacturing steps of the display apparatus according to the embodiment of the present invention.

First, as illustrated in FIG. 3A, the substrate 10, on which multiple top-emission type organic light-emitting devices are formed, is prepared. Each of the organic light-emitting devices includes the interlayer insulating film and the planarizing film formed on the substrate 10 on which the active matrix type pixel circuits are formed. Further, the anode electrode 11, the pixel isolation layer 12, the hole injection/transport organic compound layer 13, the red-light-emitting layer 14, the green-light-emitting layer 15, the blue-light-emitting layer 16, the electron injection/transport organic compound layer 17, and the cathode electrode 18 are formed thereon.

Figure 3B:
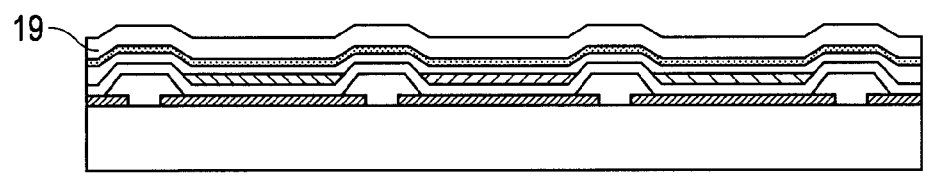

Next, as illustrated in FIG. 3B, the first protective layer 19 is formed over the entire display region. The first protective layer 19 is a member having a so-called sealing function for preventing water contained in the resin material forming the second protective layer formed thereon from coming into contact with the organic light-emitting devices. For this function, it is preferred that the first protective layer 19 be a member having high light transmittance and excellent in moisture-proof property. It is therefore preferred that the first protective layer 19 be made of a silicon nitride film or a silicon nitride oxide film.

Figure 3C:
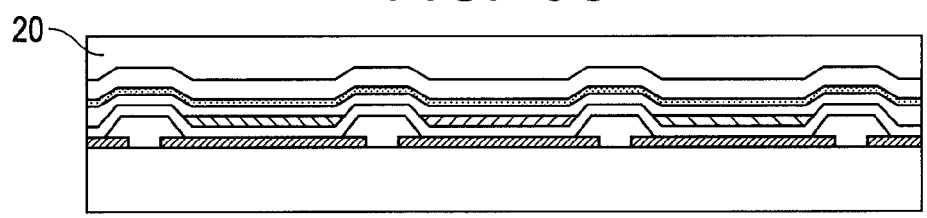

Next, as illustrated in FIG. 3C, the second protective layer 20 is formed on the first protective layer 19 over the entire display region. The second protective layer 20 is made of a resin material. A thickness of the second protective layer 20 is set to about 10 μm to 100 μm so that dust such as an etch residue can be sufficiently covered and that unevenness generated on the pixel isolation film 12 can be leveled. As the resin material, for example, a thermosetting resin, a thermoplastic resin, and a photocurable resin, which have a low water content, can be used. When a thermosetting resin or a photocurable resin is used, a spin coating method or a dispensing method can be used as a film formation method. Further, a method of bonding a film made of a thermoplastic resin, which has a thickness of about 10 μm to 100 μm, onto the first protective layer 19 under vacuum can also be used. As a specific resin material, for example, an epoxy resin and a butyl resin are suitably used.

Figure 3D:
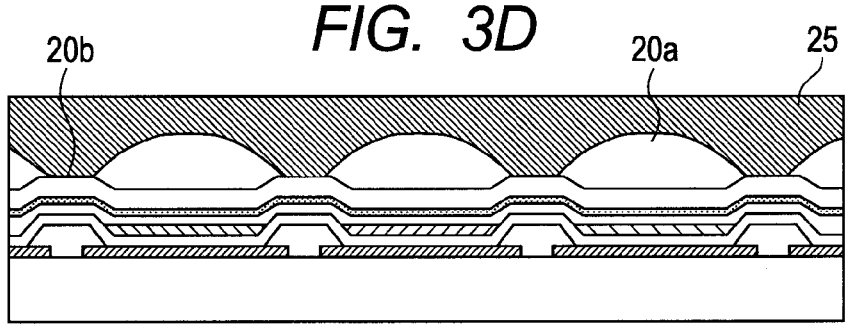

Next, as illustrated in FIG. 3D, a mold 25 for forming the microlenses 20a is prepared. The resin-material mold 25 is pressed against the resin material so that air bubbles do not enter the resin material. The shape of the mold 25 is changed for each light-emitting pixel of each color so as to adjust a light-condensing degree of the lens provided for each light-emitting pixel.

The mold 25 can be made of a general metal. When a photocurable resin is used as the resin material, it is preferred that the mold 25 be formed of a quartz substrate because the mold 25 is required to transmit light therethrough. Moreover, in order to enhance the removability of the mold 25 from the resin material, a film made of a fluorine resin or the like may be formed on a surface of the mold 25.

When a thermosetting resin is used as the resin material, the resin material is heated at 80° C. and cured in a state in which a top of a convex portion of each microlens of the mold 25 is approximately aligned with the center of the corresponding pixel. Considering that a withstand temperature of a general organic compound constituting the organic light-emitting device is about 100° C., a curing temperature of about 80° C. is preferred.

Figure 3E:
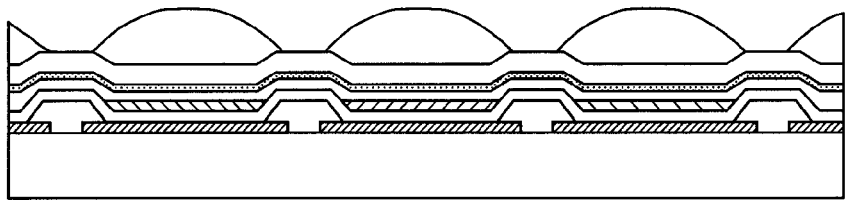

Next, as illustrated in FIG. 3E, the mold 25 is removed from the cured resin material. As a result, the microlenses 20a are formed on the surface of the second protective layer 20 so as to respectively correspond to the pixels.

A protective layer may be provided on the microlenses 20a as needed. In this case, it is preferred to design and process a surface shape of the mold 25 so as not to impair a sealing function of the protective layer formed on the microlenses 20a and so as to allow the microlenses 20a to demonstrate a desired light-condensing function.

As the protective layer provided on the microlenses 20a, a member having high light transmittance and excellent in moisture-proof property is preferred. For example, a silicon nitride film or a silicon nitride oxide film can be used. The protective layer may be made of the same material as that of the protective layer 19 formed under the microlenses 20a or a different material.

As described above, this embodiment satisfies Expression (5) described above in the pixel having the optical unit.

As described above, the organic light-emitting device is set under the optical interference condition with the lowest order. Therefore, light emitted with good color purity can be extracted with good color reproducibility to the outside of the display apparatus by the optical unit. Thus, the display apparatus having both high light-emission efficiency and good display performance can be realized.

Further, when the light is emitted from the organic light-emitting device at an angle equal to or larger than the critical angle corresponding to the upper limit angle at which the light is not totally reflected at the interface at which the light enters the microlens corresponding to the optical unit, the amount of extracted light is increased as compared with the amount of light extracted from the flat surface. Therefore, power consumption can be reduced. Further, the microlens having the light-condensing effect is used as the optical unit. Therefore, front luminance can be enhanced.

The exemplary embodiment of the present invention has been described above. However, the embodiment described above is an example for describing the present invention. The present invention can be carried out in various modes different from the embodiment described above without departing from the scope of the present invention. Various technologies can be used for forming the lens.

EXAMPLES

Next, the present invention is described further in detail with examples of the display apparatus and the manufacturing method therefor according to the present invention.

Example 1

Referring to FIGS. 3A to 3E, a method of manufacturing a display apparatus of Example 1 is described. First, on a glass substrate, pixel circuits (not shown) were formed by low-temperature polysilicon TFTs. An interlayer insulating film made of SiN and a planarizing film made of an acrylic resin were formed thereon in the stated order to form the substrate 10 illustrated in FIG. 3A. An ITO film and an AlNd film were formed to thicknesses of 10 nm and 100 nm, respectively, on the substrate 10 by sputtering. Subsequently, the ITO film and the AlNd film were patterned for each pixel to form the anode electrode 11.

An acrylic resin was spincoated thereon. Next, the acrylic resin was patterned by a photolithography technology to form an opening (opening portion corresponds to the pixel) at the position at which the anode electrode 11 was formed, thereby forming the pixel isolation layer 12. A pitch of each pixel was set to 30 µm, and the size of an exposed portion of the anode electrode 11 by forming the opening was set to 10 µm. The pixel isolation layer 12 was subjected to ultrasonic cleaning with isopropyl alcohol (IPA), followed by boiling wash and drying. Further, after UV/ozone wash, a film made of an organic compound was grown by vacuum deposition.

First, the hole injection/transport organic compound layer 13 was grown to a thickness of 39 nm, which was common to all the pixels. A degree of vacuum at this time was $1 \times 10^{-4}$ Pa, and a deposition rate was 0.2 nm/sec.

Next, a shadow mask was used to grow the hole injection/transport organic compound layer 13 to thicknesses of 18 nm and 7 nm respectively for the red-light-emitting pixels and the green-light-emitting pixels. Subsequently, for the respective light-emitting pixels, a red-light-emitting layer, a green-light-emitting layer, and a blue-light-emitting layer were grown to thicknesses of 25 nm, 20 nm, and 10 nm, respectively.

Subsequently, a film made of bathophenanthroline (Bphen) and $Cs_2CO_3$ was formed by co-evaporation (ratio by weight 90:10) to a thickness of 5 nm as the electron injection/transport layer common to all the pixels. A degree of vacuum at the time of evaporation was $3 \times 10^{-4}$ Pa, and a film-growth rate was 0.2 nm/sec.

Next, the substrate, on which the above-mentioned organic compound layers from the hole injection/transport layer to the electron injection/transport layer were grown, was moved into a sputtering apparatus while a vacuum state was maintained. An extremely thin Ag film was formed to a thickness of 12 nm as the cathode electrode 18.

Next, as illustrated in FIG. 3B, the protective layer 19 made of silicon nitride was grown to a thickness of 1 µm by a plasma CVD method using a $SiH_4$ gas, an $N_2$ gas, and an $H_2$ gas. After that, as illustrated in FIG. 3C, a thermosetting resin material (epoxy resin) having a viscosity of 3,000 mPa·s was applied under a nitrogen atmosphere at a dew-point temperature of 60° C. by using a dispenser capable of performing precise drawing (manufactured by Musashi Engineering, Inc., product name: SHOT MINI SL).

Before the thermosetting of the resin material, the mold 25 for forming the microlenses 20a, which was prepared separately, was pressed against the surface of the resin material, as illustrated in FIG. 3D. For pressing the mold, an alignment mark formed on the mold 25 was aligned with an alignment mark formed on the substrate to perform positioning. As a result, the microlenses 20a were formed in alignment with the pixels. Recesses were formed in the mold 25 in a concave shape at the same pitch as the pixel pitch. A surface of each of the recesses was coated with a Teflon (registered trademark) resin as a mold release agent. The shape of each of the recesses, specifically, the shape of each of the microlenses 20a was set to have a curvature of 25.5 µm. A height of the microlens array was 10 µm for each microlens. The microlenses have the effect of improving the front luminance by 3.55 times as compared with the case where the microlens is not provided.

The planarization is achieved with the resin material even if a foreign substance or the like is present in view of the environment of a clean room and a processing apparatus. Therefore, a minimum thickness of a microlens portion 20b (thickness at the thinnest portion) was set to 10 μm.

Heating was performed under a vacuum environment at a temperature of 100° C. for 15 minutes to cure the resin material (epoxy resin) in a state in which the mold 25 was pressed against the resin material as described above. After that, the mold 25 was released from the resin to form the microlenses 20a as illustrated in FIG. 3E.

Characteristics of the thus manufactured display apparatus were evaluated. The optical interference conditions and light-emission characteristics of the display apparatus of Example 1 were collectively shown in Table 5. The phase shift $\phi_1$ occurring when the emitted light was reflected by the anode electrode 11 was 3.84 (rad) (220.0 degrees), and the phase shift $\phi_2$ occurring when the emitted light was reflected by the cathode electrode 18 was 4.21 (rad) (241.4 degrees).

In Table 5, a cathode electrode-side order is a value of $m_2$ when $2L_2/\lambda + \phi_2/2\pi = m_2$ is satisfied using the optical distance $L_2$, the phase shift $\phi_2$, and the maximum peak wavelength $\lambda$ of the spectrum of the light emitted from the organic light-emitting device.

TABLE 5

| | | Red-light-emitting pixel | | Green-light-emitting pixel | | Blue-light-emitting pixel | |
|---|---|---|---|---|---|---|---|
| | Enhancing wavelength | 620 nm | | 520 nm | | 460 nm | |
| Optical interference conditions | Optical distance L1 | 121 nm | | 101 nm | | 89 nm | |
| | Anode electrode-side order | 1.0 | | 1.0 | | 1.0 | |
| | Optical distance L2 | 54 nm | | 45 nm | | 28 nm | |
| | Cathode electrode-side order | 0.8 | | 0.8 | | 0.8 | |
| Film thickness | Electron injection/transport layer | | | 5 nm | | | |
| | Light-emitting layer | 25 nm | | 20 nm | | 10 nm | |
| | Hole injection/transport layer | 18 nm | | 7 nm | | — | |
| | | | | 39 nm | | | |
| Refractive index | Electron injection/transport layer | 1.66 | | 1.69 | | 1.75 | |
| | Light-emitting layer | 1.83 | | 1.84 | | 1.91 | |
| | Hole injection/transport layer | 1.79 | | 1.82 | | 1.87 | |
| Chromaticity CIExy | | CIEx | CIEy | CIEx | CIEy | CIEx | CIEy |
| | | 0.675 | 0.324 | 0.271 | 0.655 | 0.135 | 0.131 |
| Color reproduction range | | | | 81.2% | | | |
| Light-emission efficiency | | 40.1 cd/A | | 76.1 cd/A | | 10.4 cd/A | |
| Power consumption | | | | 147 mW | | | |

The chromaticity and the color reproduction range was determined through weighted averaging for a total amount of the extracted light, thus being rough standards of the chromaticity and the color reproduction range. The power consumption was determined when light emission was performed on one-third of the entire area at the luminance of 250 cd/m² whose chromaticity CIE xy coordinates were (0.313, 0.329) as white with a power source of 9.5 V on a diagonal 3-inch organic EL panel having an aspect ratio of 3:4 in view of the chromaticity and the efficiency.

Comparative Example 1

For a display apparatus of Comparative Example 1, the order in the optical interference condition was set to $m_1=2$ for all the light-emitting pixels in contrast to Example 1.

Characteristics of the thus manufactured display apparatus were evaluated. The optical interference conditions and the light-emission characteristics of the display apparatus of Comparative Example 1 are collectively shown in Table 6.

TABLE 6

|  |  | Red-light-emitting pixel | Green-light-emitting pixel | Blue-light-emitting pixel |
|---|---|---|---|---|
|  | Enhancing wavelength | 620 nm | 520 nm | 460 nm |
| Optical interference conditions | Optical distance L1 | 431 nm | 361 nm | 319 nm |
|  | Anode electrode-side order | 2.0 | 2.0 | 2.0 |
|  | Optical distance L2 | 54 nm | 45 nm | 28 nm |
|  | Cathode electrode-side order | 0.8 | 0.8 | 0.8 |
| Film thickness | Electron injection/transport layer |  | 5 nm |  |
|  | Light-emitting layer | 25 nm | 20 nm | 10 nm |
|  | Hole injection/transport layer | 68 nm | 27 nm 162 nm | 0 nm |
| Refractive index | Electron injection/transport layer | 1.66 | 1.69 | 1.75 |
|  | Light-emitting layer | 1.83 | 1.84 | 1.91 |
|  | Hole injection/transport layer | 1.79 | 1.82 | 1.87 |
|  | Chromaticity CIExy | CIEx 0.665  CIEy 0.325 | CIEx 0.310  CIEy 0.657 | CIEx 0.107  CIEy 0.251 |
|  | Color reproduction range |  | 66.6% |  |
|  | Light-emission efficiency | 33.6 cd/A | 57.4 cd/A | 11.9 cd/A |
|  | Power consumption |  | 231 mW |  |

As shown in Table 6, the color purity was degraded as compared with Example 1. As a result, the color reproduction range was narrowed.

Comparative Example 2

A display apparatus of Comparative Example 2 had a configuration in which the microlenses were not provided on the protective layer 19. Otherwise, the display apparatus was manufactured in the same manner as that in Example 1.

Characteristics of the thus manufactured display apparatus were evaluated. The optical interference conditions and the light-emission characteristics of the display apparatus of Comparative Example 2 are collectively shown in Table 7.

TABLE 7

|  |  | Red-light-emitting emitting | Green-light-emitting pixel | Blue-light-emitting pixel |
|---|---|---|---|---|
|  | Enhancing wavelength | 620 nm | 520 nm | 460 nm |
| Optical interference conditions | Optical distance L1 | 121 nm | 101 nm | 89 nm |
|  | Anode electrode-side order | 1.0 | 1.0 | 1.0 |
|  | Optical distance L2 | 54 nm | 45 nm | 28 nm |
|  | Cathode electrode-side order | 0.8 | 0.8 | 0.8 |
| Film thickness | Electron injection/ transport layer |  | 5 nm |  |
|  | Light-emitting layer | 25 nm | 20 nm | 10 nm |
|  | Hole injection/ transport layer | 18 nm | 7 nm 39 nm | 0 nm |
| Refractive index | Electron injection/ transport layer | 1.66 | 1.69 | 1.75 |
|  | Light-emitting layer | 1.83 | 1.84 | 1.91 |
|  | Hole injection/ transport layer | 1.79 | 1.82 | 1.87 |

TABLE 7-continued

|  | Red-light-emitting emitting | | Green-light-emitting pixel | | Blue-light-emitting pixel | |
| --- | --- | --- | --- | --- | --- | --- |
| Chromaticity CIExy | CIEx 0.679 | CIEy 0.312 | CIEx 0.280 | CIEy 0.656 | CIEx 0.135 | CIEy 0.129 |
| Color reproduction range | | | 82.3% | | | |
| Light-emission efficiency | 6.9 cd/A | | 28.8 cd/A | | 6.4 cd/A | |
| Power consumption | | | 389 mW | | | |

As shown in Table 7, the power consumption was large as compared with Example 1, which shows the effects of condensing light and increasing the light amount obtained by the microlenses of the present invention.

Comparative Example 3

For each of the organic light-emitting devices included in a display apparatus of Comparative Example 3, the condition $m_2>1$ was set in contrast to Example 1. Specifically, each of the organic light-emitting devices satisfied the condition $2L_2/\lambda+\phi_2/2\pi>1$.

Characteristics of the thus manufactured display apparatus were evaluated. The optical interference conditions and the light-emission characteristics of the display apparatus of Comparative Example 3 are collectively shown in Table 8.

In comparison with Example 1, the color purity was low, and the color reproduction range was narrowed. Moreover, the power consumption was large.

Comparative Example 4

In a display apparatus of Comparative Example 4, the order corresponding to the optical interference condition of the blue-light-emitting pixel was set to $m_1=2$. Otherwise, the display apparatus was manufactured in the same manner as that of Example 1.

Characteristics of the thus manufactured display apparatus were evaluated. The optical interference conditions and the light-emission characteristics of the display apparatus of Comparative Example 4 are collectively shown in Table 9.

TABLE 8

|  |  | Red-light-emitting emitting | | Green-light-emitting pixel | | Blue-light-emitting pixel | |
| --- | --- | --- | --- | --- | --- | --- | --- |
| Enhancing wavelength | | 620 nm | | 520 nm | | 460 nm | |
| Optical interference conditions | Optical distance L1 | 121 nm | | 101 nm | | 89 nm | |
| | Anode electrode-side order | 1.0 | | 1.0 | | 1.0 | |
| | Optical distance L2 | 366 nm | | 343 nm | | 317 nm | |
| | Cathode electrode-side order | 1.9 | | 2.0 | | 2.0 | |
| Film thickness | Electron injection/transport layer | | | 170 nm | | | |
| | Light-emitting layer | 46 nm | | 30 nm | | 10 nm | |
| | Hole injection/transport layer | 18 nm | | 7 nm 39 nm | | — | |
| Refractive index | Electron injection/transport layer | 1.66 | | 1.69 | | 1.75 | |
| | Light-emitting layer | 1.83 | | 1.84 | | 1.91 | |
| | Hole injection/transport layer | 1.79 | | 1.82 | | 1.87 | |
| Chromaticity CIExy | | CIEx 0.656 | CIEy 0.342 | CIEx 0.312 | CIEy 0.650 | CIEx 0.126 | CIEy 0.201 |
| Color reproduction range | | | | 66.9% | | | |
| Light-emission efficiency | | 37.7 cd/A | | 68.6 cd/A | | 9.7 cd/A | |
| Power consumption | | | | 217 mW | | | |

TABLE 9

| | | Red-light-emitting emitting | Green-light-emitting pixel | Blue-light-emitting pixel |
|---|---|---|---|---|
| | Enhancing wavelength | 620 nm | 520 nm | 460 nm |
| Optical interference conditions | Optical distance L1 | 121 nm | 101 nm | 319 nm |
| | Anode electrode-side order | 1.0 | 1.0 | 2.0 |
| | Optical distance L2 | 54 nm | 45 nm | 28 nm |
| | Cathode electrode-side order | 0.8 | 0.8 | 0.8 |
| Film thickness | Electron injection/transport layer | | 5 nm | |
| | Light-emitting layer | 25 nm | 20 nm | 10 nm |
| | Hole injection/transport layer | 18 nm | 7 nm 39 nm | 123 nm |
| Refractive index | Electron injection/transport layer | 1.66 | 1.69 | 1.75 |
| | Light-emitting layer | 1.83 | 1.84 | 1.91 |
| | Hole injection/transport layer | 1.79 | 1.82 | 1.87 |
| Chromaticity CIExy | | CIEx 0.675  CIEy 0.324 | CIEx 0.271  CIEy 0.655 | CIEx 0.110  CIEy 0.240 |
| Color reproduction range | | | 69.9% | |
| Light-emission efficiency | | 40.1 cd/A | 76.1 cd/A | 14.1 cd/A |
| Power consumption | | | 185 mW | |

In comparison with Example 1, the color purity was low, and the color reproduction range was narrowed. Moreover, the power consumption was large.

Comparative Example 5

For a display apparatus of Comparative Example 5, the condition $m_2=1$ was set in contrast to Example 1. Specifically, each of the organic light-emitting devices satisfied the condition $2L_2/\lambda + \phi_2/2\pi = 1$.

Characteristics of the thus manufactured display apparatus were evaluated. The optical interference conditions and the light-emission characteristics of the display apparatus of Comparative Example 5 are collectively shown in Table 10.

TABLE 10

| | | Red-light-emitting emitting | Green-light-emitting pixel | Blue-light-emitting pixel |
|---|---|---|---|---|
| | Enhancing wavelength | 620 nm | 520 nm | 460 nm |
| Optical interference conditions | Optical distance L1 | 121 nm | 101 nm | 89 nm |
| | Anode electrode-side order | 1.0 | 1.0 | 1.0 |
| | Optical distance L2 | 109 nm | 92 nm | 76 nm |
| | Cathode electrode-side order | 1.0 | 1.0 | 1.0 |
| Film thickness | Electron injection/transport layer | | 32 nm | |
| | Light-emitting layer | 30 nm | 20 nm | 10 nm |
| | Hole injection/transport layer | 18 nm | 7 nm 39 nm | — |
| Refractive index | Electron injection/transport layer | 1.66 | 1.69 | 1.75 |
| | Light-emitting layer | 1.83 | 1.84 | 1.91 |
| | Hole injection/transport layer | 1.79 | 1.82 | 1.87 |
| Chromaticity CIExy | | CIEx 0.660  CIEy 0.337 | CIEx 0.295  CIEy 0.651 | CIEx 0.132  CIEy 0.156 |
| Color reproduction range | | | 73.4% | |
| Light-emission efficiency | | 40.8 cd/A | 77.3 cd/A | 12.0 cd/A |
| Power consumption | | | 152 mW | |

In comparison with Example 1, the color purity was low, and the color reproduction range was narrowed. Moreover, the power consumption was large.

The display apparatus according to the present invention can be applied to mobile uses for which the improvement of visibility by high luminance is important, for example, a rear monitor of a digital camera and a cellular phone display. In addition, lower power consumption is expected even at the same luminance. Therefore, the display apparatus of the present invention is also useful for outdoor uses.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

REFERENCE SIGNS LIST 10 substrate
11 anode electrode
13 hole injection/transport organic compound layer
14 light-emitting layer showing red light emission (pattern layer for each color including red-light-emitting layer)
15 light-emitting layer showing green light emission (pattern layer for each color including green-light-emitting layer)
16 light-emitting layer showing blue light emission (pattern layer for each color including blue-light-emitting layer)
17 electron injection/transport organic compound layer
18 cathode electrode
20a microlens This application claims the benefit of Japanese Patent Application Nos. 2010-266660, filed Nov. 30, 2010, and 2011-238493, filed Oct. 31, 2011, which are hereby incorporated by reference herein in their entirety.

What is claimed is:

1. A display apparatus, comprising multiple pixels,
each of the multiple pixels comprising an organic light-emitting device comprising a first electrode, a light-emitting layer, and a second electrode,
the multiple pixels comprising an optical unit for allowing a part of light emitted from the organic light-emitting device to exit to outside while changing an exiting direction thereof,
wherein, in the multiple pixels, an optical distance $L_1$ between a light-emission position of the organic light-emitting device and the first electrode and an optical distance $L_2$ between the light-emission position and the second electrode satisfy Expressions below:

$$2L_1/\lambda + \phi_1/2\pi = 1; \text{ and}$$

$$L_2 > 0, \text{ and } 2L_2/\lambda + \phi_2/2\pi < 1,$$

where $\lambda$ is a maximum peak wavelength of a spectrum of light emitted from the organic light-emitting device, $\phi_1$ is a phase shift occurring when the light emitted at the light-emission position is reflected by the first electrode, and $\phi_2$ is a phase shift occurring when the light emitted at the light-emission position is reflected by the second electrode.

2. The display apparatus according to claim 1, wherein the optical unit extracts light entering the optical unit at an angle of 30 degrees or larger.

3. The display apparatus according to claim 1, wherein the optical unit comprises a lens having a light-condensing effect.

* * * * *